United States Patent [19]

Hilland

[11] Patent Number: 5,008,770

[45] Date of Patent: Apr. 16, 1991

[54] FILTER PIN INTEGRATED CIRCUIT SOCKET KIT

[75] Inventor: David H. Hilland, Albuquerque, N. Mex.

[73] Assignee: The United States of America as represented by the Secretary of the Air Force, Washington, D.C.

[21] Appl. No.: 481,920

[22] Filed: Feb. 20, 1990

[51] Int. Cl.$^5$ ............................................. H02H 9/04
[52] U.S. Cl. ..................................... 361/56; 361/111; 361/127; 361/406
[58] Field of Search .................. 361/111, 56, 58, 127, 361/400, 409, 406

[56] References Cited

U.S. PATENT DOCUMENTS

| | | | |
|---|---|---|---|
| 3,555,374 | 1/1971 | Usuda | 307/202 |
| 3,685,002 | 8/1972 | Kennedy | 361/403 |
| 4,198,613 | 4/1980 | Whitley | 361/111 |
| 4,409,471 | 10/1983 | Aigo | 235/492 |
| 4,559,579 | 12/1985 | Val | 361/56 |
| 4,928,199 | 5/1990 | Diaz et al. | 361/111 |

Primary Examiner—Todd E. DeBoer
Attorney, Agent, or Firm—Bernard E. Franz; Donald J. Singer

[57] ABSTRACT

This is a device for electromagnetic transient protection for integrated circuit boards in a convenient and easily customized package. The device comprises an array of transient protection devices (TPDs) made in the form of sleeves on hollow pins and installed in a fiberglass board. The board has a copper coating to conduct transients away from the pin of the IC. The array of TPDs on the fiberglass board corresponds to the leg spacing of the IC being protected. The device is soldered onto the circuit board and the IC is in turn plugged into it possibly using a friction fit or else it is soldered. An unwanted transient signal enters the device and the IC simultaneously from the circuit board land. The device sees the transient and changes from a high impedance "off" state to its low impedance "on" state and conducts the transient away from the IC. The other pins remain off unless transients are also present at these pins. The TPDs may comprise metal oxide varistors in tubular form, zener diodes or surgectors.

3 Claims, 2 Drawing Sheets

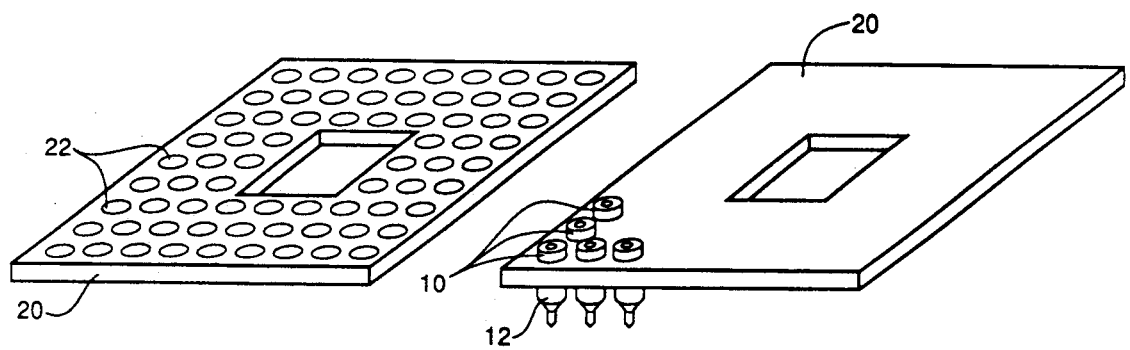
Fig. 1  Fig. 1a
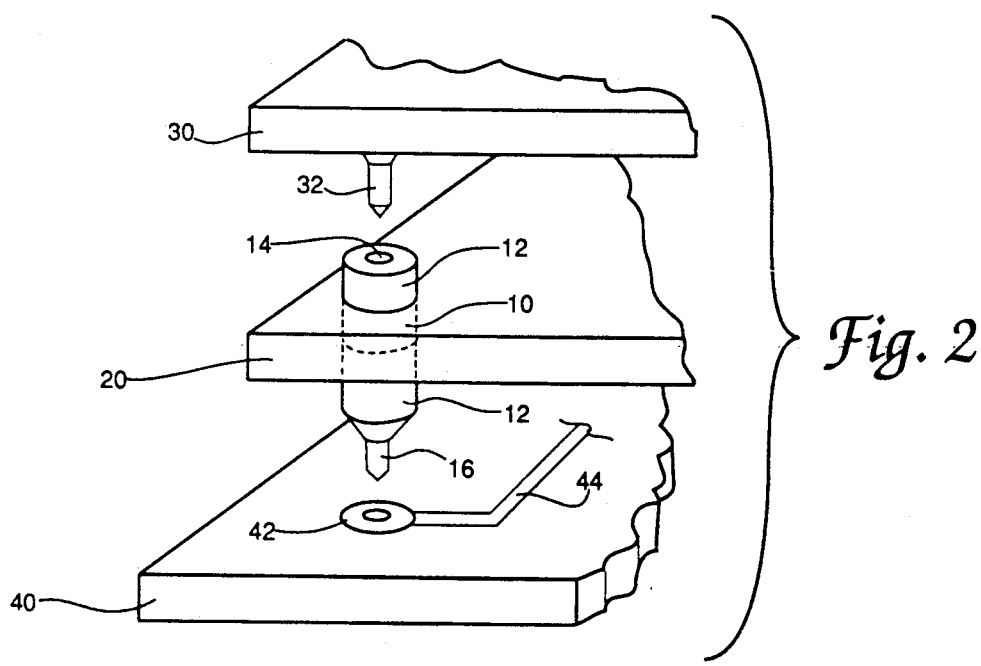
Fig. 2

5,008,770

FILTER PIN INTEGRATED CIRCUIT SOCKET KIT

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a filter pin integrated circuit socket kit, and more particularly to a device for providing electromagnetic protection to integrated circuits in a convenient and easily customized package.

Electrical transients can cause "upset" of circuit operations or actually destroy the circuit components including integrated circuits (ICs). Systems are protected against this threat by using shielding, filters and electrical surge arrestors (ESAs) on the outside of circuit boxes, and metal oxide varistors transorbs, surgectors, zener diodes, and spark gaps on power and signal lines. These are all discrete circuit components which use up valuable circuit board space, must be specified at design time, and are expensive when applied individually. As a result, some circuits are designed and built without adequate transient protection. The discrete devices also add parasitic capacitance and inductance to the circuit which may affect circuit performance.

United States patents of interest include U.S. Pat. No. 3,555,374, to Usuda, which teaches a field effect transistor having a protective diode in its gate region to protect the gate electrode from dielectric breakdown. U.S. Pat. No. 4,409,471 to Aigo provides conductor strips wherein all conductor strips of each chip are connected together protecting the semiconductor chip from electrostatic breakdown.

SUMMARY OF THE INVENTION

An objective of the invention is to provide a device for electromagnetic protection of integrated circuits in a convenient and easily customized package.

The device according to the invention comprises an array of transient protection devices (TPDs) made in the form of sleeves on hollow pins and installed in a fiberglass board. The board has a copper coating to conduct transients away from the pin of the IC. The array of TPDs on the fiberglass board corresponds to the leg spacing of the IC being protected. The device is soldered onto the circuit board and the IC is in turn plugged into it possibly using a friction fit or else it is soldered. An unwanted transient signal enters the device and the IC simultaneously from the circuit board land. The device sees the transient and changes from a high impedance "off" state to its low impedance "on" state and conducts the transient away from the IC. The other pins remain off unless transients are also present at these pins. The TPDs may comprise metal oxide varistors in tubular form, zener diodes or surgectors.

BRIEF DESCRIPTION OF THE DRAWING

FIG. 1 is a pictorial view of a fiberglass board with holes;

FIG. 1a is a pictorial view of the fiberglass board showing transient protection devices (TPDs) inserted into the holes:

FIG. 2 is an exploded view showing the assembly for one transient protection device with the fiberglass board and a printed circuit board;

DETAILED DESCRIPTION

The FILTER PIN INTEGRATED CIRCUIT SOCKET KIT (FPICS) is a package (FIGS. 1 and 1a) which uses a device such as a diode or metal oxide Varistor (GE trademark) or Surgector (RCA trademark) to protect each leg of an integrated circuit (IC) from damage due to electromagnetic transients, or over voltages or power surges. The device protects the IC by existing between the legs/leads of the integrated circuit and the ground plane formed by the IC socket. The IC socket ground planes are all attached to system ground. Discrete devices are presently the only way to provide any protection to ICs. Discrete devices are expensive to use and require lots of space on a circuit board. For this reason discrete devices are only used to protect a few pins of critical ICs. Instead of a discrete device this invention substitutes a filter pin type design as the legs/leads of the IC socket. The IC socket could be manufactured with all diodes or all MOVs (metal oxide Varistors) or a combination of devices. The important point is that the filter pins are selectable for a given IC socket in order to build a custom protection package. Also the individual legs/leads could be manufactured and supplied with different clamping voltages or trigger levels depending on whether the pin being protected is a power supply or signal pin, and the voltage levels at which the pin operates. Generic FPICSs might have diodes or MOVs set at 30–45 volts while custom devices would tailor the clamping voltages to match the integrated circuit of concern. Another option is a FPICS Kit which allows the end user to select the appropriate pins and assemble the IC socket on location. The FPICS is soldered in place on a printed circuit board just as a regular IC socket would be. Then the IC plugs into the FPICS. Not all pins must have TPDs.

The FPICS can be used to protect integrated circuits in system critical locations such as weapons system electronics or communication system electronics which might be exposed to transient over voltages resulting from a nuclear electromagnetic pulse, lightning, electric motor switching, or other power surges typically found on AC power mains. The FPICS is meant to be one component which is an option in a layered approach to transient protection. Other options will include filters and electrical surge arrestors at the system and circuit box level rather than the Integrated Circuit level.

Figure 3:
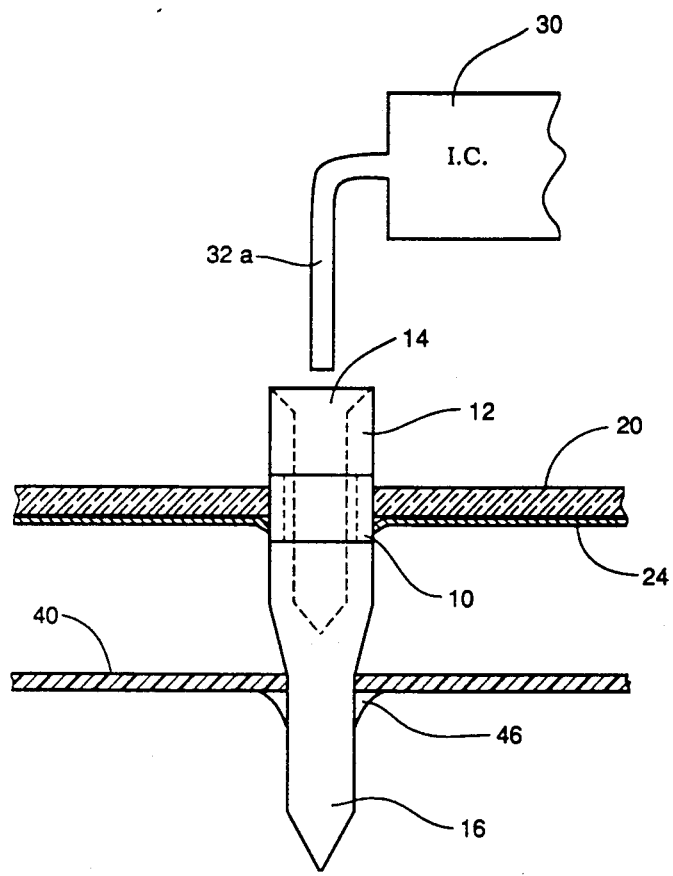
FIG. 3 is a sectional view of one transient protection device with the fiberglass board, the printed circuit board, and an integrated circuit.

The FPICS comprises an array (FIGS. 1 and 1a) of transient protection devices (TPDs) manufactured in the form of sleeves (FIG. 3) on hollow pins and installed in a fiberglass board as shown in FIGS. 1-4. A fiberglass board shaped like an integrated circuit is shown in FIG. 1. Holes 22 drilled through the board 20 line up with integrated circuit legs or leads. FIG. 1a shows transient protection devices 10 inserted through the holes of the fiberglass board 20. As shown in FIG. 3, the fiberglass board 20 has a copper coating 24 to conduct transients away from the pin/leg and to system ground.

The exploded view of FIG. 2 shows how the fiberglass board 20 with the transient protection devices 10 are included with an integrated circuit 30 on a printed circuit board 40. A sectional view of the assembly is shown in FIG. 3. FIG. 2 shows an integrated circuit having leads 32 while FIG. 3 shows legs 32a. Each transient protection device (TPD) is a cylindrical unit 10 mounted on a metal socket pin 12. Each of the socket pins 12 has a cylindrical hole 14 in the top for receiving a lead/leg of the integrated circuit 30. Each of the socket pins 12 also has a pointed tip 16 for insertion in the printed circuit board 40. The transient protection device 10 is friction fitted into the fiberglass board 20. The metal socket pin 12 is inserted into one of the regular printed circuit holes 42 of the printed circuit board 40 with a friction fit, or soldered as shown by solder 46 in FIG. 3. The leads or legs of the integrated circuit 30 are inserted into the holes 14 of the socket pins 12, instead of directly into the printed circuit board 40.

The pin/leg array corresponds to the leg spacing of the IC being protected. The FPICS device is soldered onto the circuit board and the IC being protected plugs into the FPICS, possibly using a friction fit or else soldered. An unwanted transient signal enters the FPICS device and the IC simultaneously from the circuit board "land" 44 (FIG. 2). The FPICS pin 12 sees the transient and changes from a high impedance "off" state to its low impedance "on" state and conducts the transient away from the IC. The other pins remain off unless transients ar also present at these pins. Operation of one pin does not affect the operation of another, in fact some of the pins may have metal oxide varistors in tubular form built in while others have zener diodes or surgectors built in. Each will respond to a transient in a different way depending on the device characteristics which are built in to the TPD.

Figure 4:
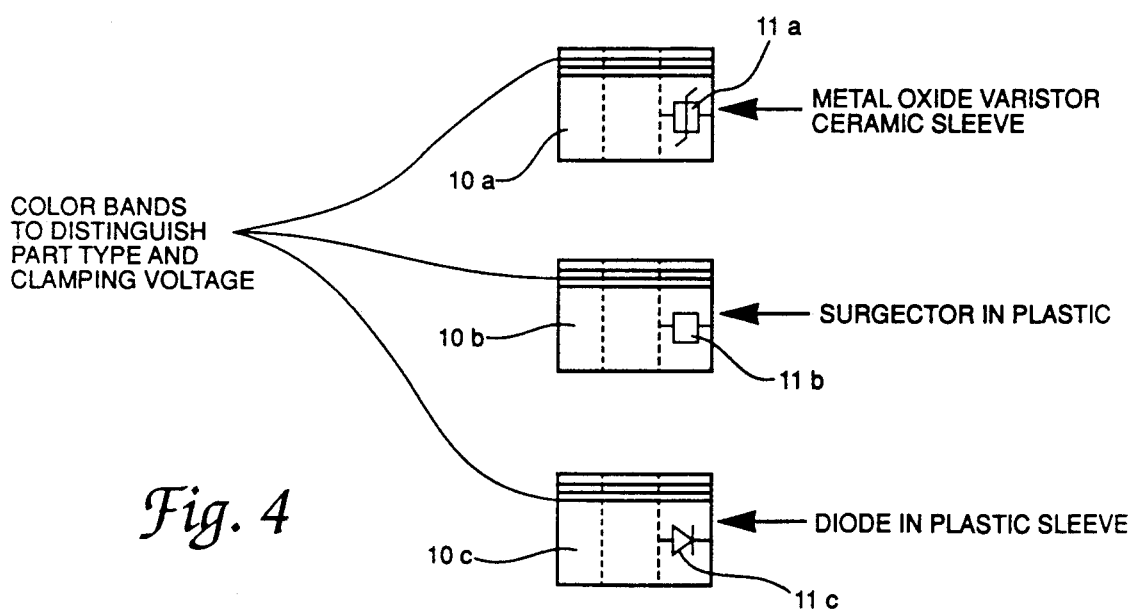
FIG. 4 is a diagram showing transient protection devices with three types of protection devices.

FIG. 4 shows three types of transient protection devices (TPDs), with color bands to distinguish part type and clamping voltage. The TPD 10a has a metal oxide varister 11a on a ceramic sleeve, the TPD 10b has a surgector 11b on plastic, and the TPD 10c has a metal oxide varistor on a ceramic sleeve.

The FPICS can be built-up by the manufacturer for a specific IC or can be delivered to the user in kit form with standard sized fiberglass boards for most ICs and a selection of filter pins/legs which will be suitable for most applications. Components of the kit are shown. The pins are installed in the board using some appropriate tool using either a friction fit or by soldering. Metal Oxide Varistors are already available in a cylindrical shape to fit around the FPICS leg. Diodes and surgectors will require some repackaging in order to be used in this manner, but such changes will be trivial for a device manufacturer.

ADVANTAGES AND NEW FEATURES

The advantages of this package are convenience in installing transient protection and the fact that no additional circuit board space is required to implement the protection. The FPICS fits under the IC being protected so it only increases the standoff height of the circuit board. Also the devices are small with almost no leads so that the parasitic capacitance and lead inductance is small. New features include: (1) the type of device and the clamping voltage can be selected for a custom application for each pin/leg. For example a power supply input might need a surgector while a signal line IC input might need a diode for protection. (2) The FPICS kit can be prefabricated when larger quantities are required or custom assembled for prototype or one-of-a-kind circuits by a technician. (3) The technician can swap different TPDs with different clamping voltages to determine the optimum values experimentally when solving difficult transient protection problems. (4) This type of IC protection is not presently available in any form other than using discrete diodes, capacitors, etc. on individual legs of an IC. The FPICS fits under the IC and saves circuit board space while reducing parasitic effects. (5) The FPICS will increase the expected lifetime of an IC by reducing the cumulative damage from transient surges. The convenience will encourage designers to use IC transient protection in applications which were previously at risk from electrical surges and therefore the FPICS has the potential to increase the life of any system from weapons system electronics to consumer electronics.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A transient protection assembly comprising a protection board which has a plurality of holes and a metal surface, a plurality of metal socket pins, a plurality of transient protection devices in the form of sleeves with each having an inner surface and an outer surface, each transient protection device being mounted on one of the socket pins with its inner surface in contact with the socket pin so that the combination of a socket pin and a transient protection device forms a filter pin socket device, each filter pin socket device being mounted in a hole of the protection board with the outer surface of the transient protection device contacting said metal surface, each said socket pin having a hole in a first end for receiving a lead of an integrated circuit, and each said socket pin having a second end for insertion into a circuit hole of a printed circuit board.

2. A transient protection assembly according to claim 1, wherein there are a number of different types and clamping voltage ratings for the transient protection devices, each filter pin socket device has a transient protection device of a type and clamping voltage rating selected as required for a circuit, and in which only part of the socket pins mounted in holes of the protection board have transient protection devices.

3. A filter pin integrated circuit socket kit comprising a protection board which has a plurality of holes and a metal surface, a plurality of metal socket pins, and a plurality of transient protection devices in the form of sleeves with each having an inner surface and an outer surface;

each transient protection device being adapted for mounting on one of the socket pins with its inner surface in contact with the socket pin so that the combination of a socket pin and a transient protection device forms a filter pin socket device, each filter pin socket device being adapted for mounting in a hole of the protection board with the outer surface of the transient protection device contacting said metal surface, each said socket pin having a hole in a first end for receiving a lead of an integrated circuit, and each said socket pin having a second end for insertion into a circuit hole of a printed circuit board;

wherein there are a number of different types and clamping voltage ratings for the transient protection devices, so that each filter pin socket device may have a transient protection device of a type and clamping voltage rating selected as required for a circuit.

* * * * *